(12) United States Patent
Kanazawa

(10) Patent No.: US 8,052,824 B2
(45) Date of Patent: Nov. 8, 2011

(54) FILM PEELING METHOD AND FILM PEELING DEVICE

(75) Inventor: Masaki Kanazawa, Hachioji (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 602 days.

(21) Appl. No.: 12/084,473

(22) PCT Filed: Jul. 5, 2006

(86) PCT No.: PCT/JP2006/313807
§ 371 (c)(1), (2), (4) Date: May 2, 2008

(87) PCT Pub. No.: WO2007/052387
PCT Pub. Date: May 10, 2007

(65) Prior Publication Data
US 2009/0107634 A1    Apr. 30, 2009

(30) Foreign Application Priority Data
Nov. 4, 2005  (JP) .................................. 2005-320636

(51) Int. Cl.
*B29C 63/00* (2006.01)

(52) U.S. Cl. ........ 156/247; 156/344; 156/153; 156/241; 156/299; 156/289; 29/239; 29/426.1; 29/426.3; 29/426.5; 226/96; 438/458; 438/459

(58) Field of Classification Search ............... 156/241, 156/247, 299, 344, 584, 289; 29/239, 426.1, 29/426.3, 426.5; 226/96; 438/458, 459
See application file for complete search history.

(56) References Cited

U.S. PATENT DOCUMENTS 5,891,298 A    4/1999   Kuroda et al.
(Continued)

FOREIGN PATENT DOCUMENTS

EP    1 381 076 A2    1/2004
(Continued)

OTHER PUBLICATIONS

International Search Report, dated Oct. 17, 2006, corresponding to PCT/JP2006/313807.
(Continued)

*Primary Examiner* — Khanh P Nguyen
*Assistant Examiner* — Keith Aziz
(74) *Attorney, Agent, or Firm* — Christie, Parker & Hale LLP

(57) ABSTRACT

There is provided a film peeling device (100) for peeling a film (3) stuck onto a first portion (121) containing a peripheral portion of a wafer (20) and also stuck onto a second portion (122) located inward with respect to the first portion, comprising: a moving means (61, 62) for relatively moving the first portion and/or second portion so that the film of the first portion of the wafer can be located at a position higher than the film of the second portion; a tape drawing means (142) for drawing out a peeling tape (103) onto the film stuck onto the first and the second portion; and a peeling means (146) for peeling the film from the first and the second portion of the wafer when the peeling tape drawn out from the tape drawing means is pressed against only the first portion film and moved along the first portion. Due to the foregoing, it is possible to prevent the wafer from being damaged at the time of peeling the front surface protection film.

5 Claims, 9 Drawing Sheets

U.S. PATENT DOCUMENTS

| | | | |
|---|---|---|---|
| 6,700,631 | B1 | 3/2004 | Inoue et al. |
| 6,824,643 | B2 | 11/2004 | Yoshimoto et al. |
| 7,634,680 | B2 * | 12/2009 | Shima ............................. 714/4 |
| 2005/0016678 | A1 * | 1/2005 | Kurosawa ..................... 156/344 |
| 2006/0068566 | A1 * | 3/2006 | Ametani ....................... 438/459 |
| 2008/0113486 | A1 * | 5/2008 | Eguchi et al. ................. 438/458 |

FOREIGN PATENT DOCUMENTS

| | | |
|---|---|---|
| JP | 8-55823 | 2/1996 |
| JP | 2000-173961 | 6/2000 |
| JP | 2000-331963 | 11/2000 |
| JP | 2000-353710 | 12/2000 |
| JP | 2004-307724 A | 11/2004 |
| JP | 2004-311576 | 11/2004 |
| JP | 2006-156456 | 6/2006 |
| TW | 412774 | 11/2000 |
| TW | 540089 | 7/2003 |
| TW | 542786 | 7/2003 |
| TW | 587990 | 5/2004 |
| TW | 200503091 | 1/2005 |

OTHER PUBLICATIONS

Patent Abstracts of Japan, Publication 08055823, Published Feb. 27, 1996, for Taya et al.

Patent Abstracts of Japan, Publication 2000-173961, Published Jun. 23, 2000, for Nakano.

Patent Abstracts of Japan, Publication 2000331963, Published Nov. 30, 2000, for Ishikawa et al.

Patent Abstracts of Japan, Publication 2000353710, Published Dec. 19, 2000, for Numata.

Patent Abstracts of Japan, Publication 2004311576, Published Nov. 4, 2004, for Taku et al.

Patent Abstracts of Japan, Publication 2006156456, Published Jun. 15, 2006, for Arisa.

Patent Abstracts of Japan and English machine translation of JP 2003-093964.

Patent Abstracts of Japan and English machine translation of JP 2003-071375.

European Search Report for corresponding European Patent Application No. EP 06 78 0977.2, dated Sep. 27, 2010, 6pp.

* cited by examiner

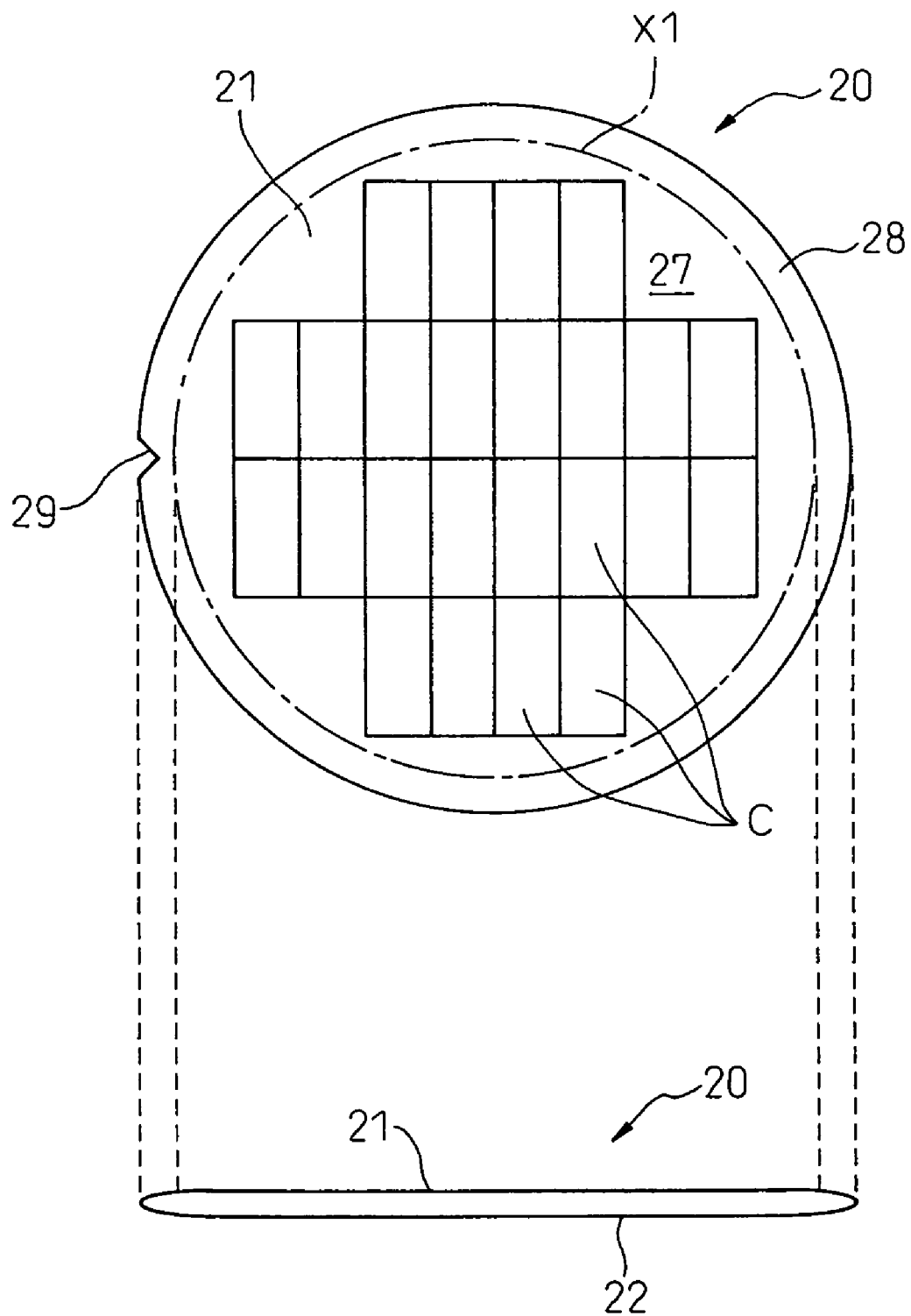

FILM PEELING METHOD AND FILM PEELING DEVICE

CROSS-REFERENCE TO RELATED APPLICATION

This application is a National Phase Patent Application and claims the priority of International Application Number PCT/JP2006/313807, filed on Jul. 5, 2006, which claims priority of Japanese Patent Application Number 2005-320636, filed on Nov. 4, 2005.

TECHNICAL FIELD

The present invention relates to a film peeling method of peeling a film stuck onto a front surface of a wafer and specifically a film peeling method of peeling a front surface protection film stuck onto a front surface of a wafer. The present invention also relates to a film peeling device for executing this film peeling method.

BACKGROUND ART

Recently, large-sized wafers are being increasingly used in the field of manufacturing semiconductors. In order to increase the mounting density, the wafer thickness has been reduced, and in order to reduce the wafer thickness, back grinding (back surface grinding) is performed in which a back surface of the wafer is ground. Before back grinding, in order to protect a semiconductor element formed on a front surface of the wafer, a surface protection film is stuck onto the front surface of the wafer, the front surface of the wafer is sucked onto a suction table, and the back surface of the wafer is ground.

Since chamfer portions are formed in a peripheral portion of the wafer to prevent the generation of dust, the width of a cross-section of the wafer at an edge portion is reduced toward to a forward end portion. Since there is a requirement to grind the back surface of the wafer, beyond half of the wafer thickness, the thin chamfered edge becomes too thin.

In order to solve the above problem, Japanese Unexamined Patent Publication No. 2000-173961 discloses the following technique. A cutout portion is formed in a boundary between a chamfer portion of the peripheral portion and a flat portion of the wafer. Then, a back surface of the wafer is ground until the wafer thickness is reduced exceeding the depth of the cutout portion. In this case, if there are cracks or damage in the peripheral portion of the wafer, the occurrence of cracks or damage can be stopped at the cutout portion. Accordingly, deterioration of a semiconductor element arranged in the flat portion of the wafer can be prevented. Concerning this matter, refer to Japanese Unexamined Patent Publication No. 2000-173961.

However, sticking the front surface protection film and grinding the back surface of the wafer are closely related to each other. At the time of grinding the back surface of the wafer, in order to protect the semiconductor element, it is necessary to stick the surface protection film onto the wafer. Since the wafer thickness is considerably decreased after grinding the back surface of the wafer, when the front surface protective film is peeled away from the wafer after grinding the back surface, it is necessary to prevent the semiconductor element arranged on the wafer from being damaged.

On the other hand, the device described in Reference Document 1 makes it possible to prevent the generation of cracks or damage on the wafer at the time of grinding the back surface. However, at the time of peeling the front surface protection film away from the wafer after grinding the back surface of the wafer, there is a possibility that the peripheral portion of the wafer may become cracked or damaged.

The present invention has been accomplished in view of the above circumstances. An object of the present invention is to provide a film peeling method capable of preventing a wafer from being damaged when a front surface protection film, which is stuck onto a front surface of the wafer, is peeled away from the wafer. Another object of the present invention is to provide a film peeling device for executing this film peeling method.

DISCLOSURE OF THE INVENTION

In order to accomplish the above object, the first aspect provides a film peeling method for peeling a film stuck to a first portion including a peripheral portion of a wafer, and also stuck to a second portion located inward with respect to the first portion, comprising the steps of: moving relatively the first portion and/or the second portion of the wafer so that the film of the first portion can be located at a position higher than the film of the second portion; drawing out a peeling tape onto the film stuck onto the first and the second portion; and pressing a peeling means against the film in the first portion via the peeling tape, wherein when the peeling means is moved along the first portion, the film is peeled away from the first and second portion of the wafer.

In the first aspect, the first portion is located at a position higher than the second portion and the peeling means is only pressed against the first portion via the peeling tape. Accordingly, a load from the peeling means is only applied on the first portion of the wafer, i.e., the load from the peeling means is applied only on a portion containing the peripheral portion of the wafer, which is not used in the future. Therefore, even if the first portion of the wafer is cracked or damaged, the second portion, in which the semiconductor element is formed, is not affected by the crack or damage caused in the first portion. Accordingly, in the first aspect, the film can be peeled away from the wafer without damaging the second portion of the wafer after the grinding of the back surface.

The second aspect provides a film peeling method comprising the steps of: forming a groove on one face of a wafer along an entire peripheral portion of the wafer inside the peripheral portion of the wafer; sticking a film onto the face of the wafer on which the groove is formed; and grinding a face of the wafer, which is on the opposite side of the wafer, until reaching at least a bottom portion of the groove so that the wafer can be divided into a first portion including the peripheral portion and the second portion located inward with respect to the first portion, the film peeling method further comprising: moving relatively the first portion and/or the second portion of the wafer so that the film of the first portion can be located at a position higher than the film of the second portion; drawing out a peeling tape onto the film stuck onto the first and the second portion; and pressing a peeling means against the film in the first portion via the peeling tape, wherein when the peeling means is moved along the first portion, the film is peeled away from the first and the second portion of the wafer.

In the second aspect, the first portion is located at a position higher than the second portion and the peeling means is pressed only against the first portion via the peeling tape. Accordingly, a load from the peeling means is applied only on the first portion of the wafer, i.e., the load from the peeling means is applied upon only a portion containing the peripheral portion of the wafer, which is not used in the future. Therefore, even if the first portion of the wafer is cracked or damaged, the second portion, in which the semiconductor element is formed, is not affected by the cracks or damage caused in the first portion. Accordingly, in the second aspect, the film can be peeled away from the wafer without damaging the second portion of the wafer after grinding of the back surface. Further, in the second embodiment, at the time of grinding the face of the wafer opposed to the one face, i.e., at the time of grinding the back surface of the wafer, cracks or damage, which may form in the peripheral portion of the wafer, can be stopped at the groove position. Therefore, the generation of cracks or damage caused at the time of grinding the back surface can be stopped in a portion containing the peripheral portion of the wafer, i.e., the generation of cracks or damage can be stopped only in the first portion.

The third aspect provides a film peeling method comprising the steps of: sticking a film onto one face of a wafer; grinding a face on the opposite side to the one face of the wafer; and forming a groove on the opposite side of the wafer along an overall peripheral portion of the wafer inside the peripheral portion of the wafer so that the groove can reach the one side of the wafer, wherein the wafer is divided into a first portion, which contains the peripheral portion, and a second portion located inward with respect to the first portion, the film peeling method further comprising the steps of: moving relatively the first portion and/or the second portion of the wafer so that the film of the first portion can be located at a position higher than the film of the second portion; drawing out a peeling tape onto the film stuck onto the first and the second portion; and pressing a peeling means against the first portion film via the peeling tape, wherein the film is peeled away from the first and the second portion when the peeling means is moved along the first portion.

According to the third aspect, it is possible to provide the same advantages as those of the second aspect.

The fourth aspect provides a film peeling method as in aspect 2 or 3, wherein the groove is formed when a reforming region is formed in the wafer by irradiating laser beams.

In the fourth aspect, the groove can be formed on the surface of the wafer without generating cracks which are located out of a cutting line and also without melting the front surface of the wafer.

The fifth aspect provides a film peeling method as in one of aspects 1 to 4, wherein the groove is formed on a boundary between the chamfer portion and the flat portion of the wafer or inside the boundary.

In the fifth aspect, a step portion is formed between the first and the second portion so that the peeling means can not press the second portion. Accordingly, it is possible to reduce a distance of moving the first portion and/or the second portion.

The sixth aspect provides a film peeling device for peeling a film stuck onto a first portion containing a peripheral portion of a wafer and also stuck onto a second portion located inward with respect to the first portion, comprising: a moving means for relatively moving the first portion and/or second portion so that the film of the first portion of the wafer can be located at a position higher than the film of the second portion; a tape drawing means for drawing out a peeling tape onto the film stuck onto the first and the second portion; and a peeling means for peeling the film from the first and the second portion of the wafer when the peeling tape drawn out from the tape drawing means is pressed against only the first portion film and moved along the first portion.

In the sixth aspect, the first portion is located at a position higher than the second portion and the peeling means is pressed against only the first portion via the peeling tape. Accordingly, a load from the peeling means is applied upon only the first portion of the wafer, i.e., the load from the peeling means is applied upon only a portion containing the peripheral portion of the wafer. This first portion is not used in the future. Therefore, even if the first portion of the wafer is cracked or damaged, the second portion, in which the semiconductor element is formed, is not affected by the cracks or damage caused in the first portion. Accordingly, in the sixth aspect, the film can be peeled away from the wafer without damaging the second portion of the wafer after the completion of grinding the back surface.

The seventh aspect provides a film peeling device comprising: a groove forming means for forming a groove inside a peripheral portion of a wafer along the overall peripheral portion of the wafer on one face of the wafer; a film sticking means for sticking a film onto the one face of the wafer on which the groove has been formed; and a grinding means for grinding a face of the wafer opposite to the one face until reaching at least a bottom portion of the groove, wherein the wafer is divided into a first portion containing the peripheral portion and a second portion located inward the first portion, the film peeling device further comprising: a moving means for relatively moving the first portion and/or second portion so that the film of the first portion of the wafer can be located at a position higher than the film of the second portion; a tape drawing means for drawing out a peeling tape onto the film stuck onto the first and the second portion; and a peeling means for peeling the film from the first and the second portion of the wafer when the peeling tape drawn out from the tape drawing means is pressed against only the first portion film and moved along the first portion.

In the seventh aspect, the first portion is located at a position higher than the second portion and the peeling means is pressed against only the first portion via the peeling tape. Accordingly, a load from the peeling means is applied only on the first portion of the wafer, i.e., the load from the peeling means is applied upon only a portion containing the peripheral portion of the wafer, which is not used in the future. Therefore, even if the first portion of the wafer is cracked or damaged, the second portion, in which the semiconductor element is formed, is not affected by the cracks or damage caused in the first portion. Accordingly, in the seventh aspect, the film can be peeled away from the wafer without damaging the second portion of the wafer after the completion of grinding the back surface. Further, in the seventh embodiment, at the time of grinding the face of the wafer opposed to the one face, i.e., at the time of grinding the back surface of the wafer, cracks or damage, which proceed from the peripheral portion of the wafer, can be stopped at the groove position. Therefore, the generation of cracks or damage caused at the time of grinding the back surface can be stopped in a portion containing the peripheral portion of the wafer, i.e., the generation of cracks or damage can be stopped only in the first portion.

The eighth aspect provides a film peeling device comprising: a film sticking means for sticking a film onto one face of a wafer; a grinding means for grinding a face on the opposite side to the one face of the wafer; and a groove forming means for forming a groove on the opposite face of the wafer along an overall peripheral portion of the wafer inside the peripheral portion until the groove reaches the one face of the wafer, wherein the wafer is divided into a first portion containing the peripheral portion and a second portion located inward the first portion, the film peeling device further comprising: a moving means for relatively moving the first portion and/or second portion so that the film of the first portion of the wafer can be located at a position higher than the film of the second portion; a tape drawing means for drawing out a peeling tape onto the film stuck onto the first and the second portion; and a peeling means for peeling the film from the first and the second portion of the wafer when the peeling tape drawn out from the tape drawing means is pressed against only the first portion film and moved along the first portion.

In the eighth aspect, it is possible to provide the same advantages as those of the seventh aspect.

The ninth aspect provides a film peeling device as in the aspect 7 or 8, wherein the groove is formed when a reforming region is formed in the wafer by irradiating laser beams.

In the ninth aspect, the groove can be formed on the surface of the wafer without generating cracks which are located out of a cutting line and also without melting the front surface of the wafer.

The tenth aspect provides a film peeling device as in one of aspects 6 to 9, wherein the groove is formed on a boundary between the chamfer portion and the flat portion of the wafer or inside the boundary.

In the tenth aspect, a step portion is formed between the first and the second portion so that the peeling means can not press the second portion. Accordingly, it is possible to reduce a distance of moving the first portion and/or the second portion.

According to each aspect, it is possible to provide a common advantage that the wafer can be prevented from being damaged at the time of peeling the film stuck onto the front surface of the wafer.

Further, according to the second and the third aspect, it is possible to provide an advantage that cracks or damage generated on the wafer at the time of grinding the back surface can be stopped only in the first portion.

Furthermore, according to the fourth aspect, it is possible to provide an advantage that the front surface of the wafer is not melted.

Furthermore, according to the fifth aspect, it is possible to provide an advantage that a distance of moving the first portion and/or the second portion can be reduced.

Furthermore, according to the seventh and the eighth aspect, it is possible to provide an advantage that cracks or damage generated on the wafer at the time of grinding the back surface can be stopped only in the first portion.

Furthermore, according to the ninth aspect, it is possible to provide an advantage that the front surface of the wafer is not melted.

Furthermore, according to the tenth aspect, it is possible to provide an advantage that a distance of moving the first portion and/or the second portion can be reduced.

BRIEF DESCRIPTION OF THE DRAWINGS

FIG. 2 is a view showing a wafer.

FIG. 9b is a schematic side view showing a state of a wafer after the completion of grinding a back surface in FIG. 9a.

BEST MODE FOR CARRYING OUT THE INVENTION

Figure 1:
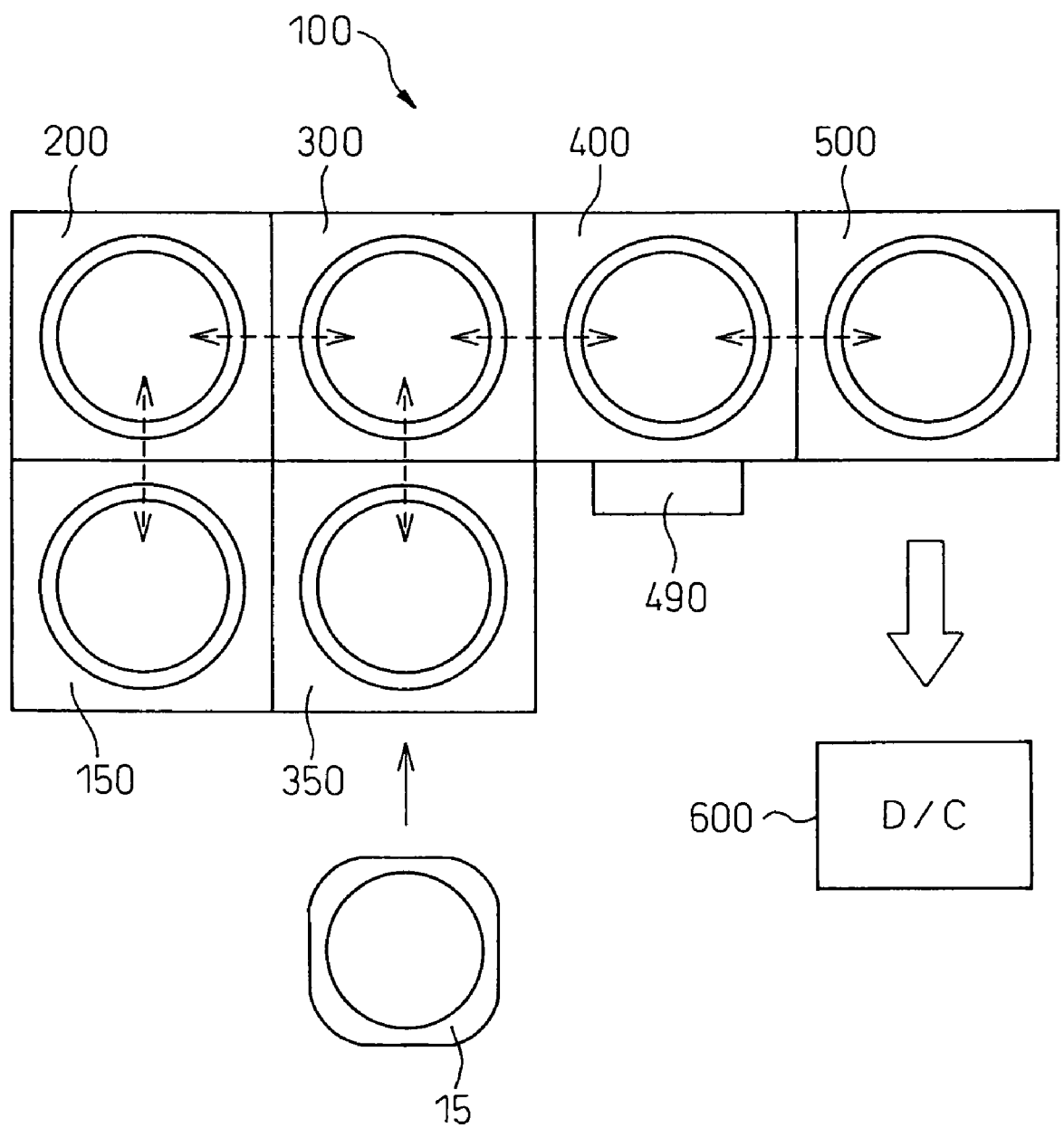
FIG. 1 is a schematic illustration showing a wafer processing device of the present invention.

Referring to the accompanying drawings, an embodiment of the present invention will be explained below. Like reference characters are used to indicate like members in the following drawings. In order to facilitate the understandings, reduced scales used in these drawings are appropriately changed.

FIG. 1 is a schematic illustration showing a wafer processing device of the present invention. FIG. 2 is a view showing a wafer. As shown in FIG. 2, on the front surface 21 of the wafer 20, a plurality of circuit patterns C, which are formed into a grid-shape in the previous step, are provided. As can be seen from FIG. 2, all the circuit patterns C are formed on the flat portion 27 of the wafer 20. A peripheral portion of the wafer 20 located in the periphery of the flat portion 27 is formed into a chamfer portion 28. In this connection, on the back surface 22 of the wafer 20, no circuit patterns C are formed. The wafer 20 described above is supplied to the wafer processing device 100 shown in FIG. 1.

As shown in FIG. 1, the wafer processing device 100 includes: a preceding dicing unit 150 for forming a groove or a cutout portion on the front surface 21 of the wafer 20; a sticking unit 200 for sticking a front surface protection film 3 onto the front surface 21 of the wafer 20; an inversion unit 300 for inverting the wafer 20 upside down; a back surface grinding unit 350 for grinding a back surface 22 of the wafer 20; a UV irradiation unit 400 for irradiating ultraviolet rays (UV) onto the front surface protection film 3 of the wafer 20; and a peeling unit 500 for peeling the front surface protection film 2 of the wafer 20. Conveying devices, for example robot arms, for conveying the wafer 20 between the respective units are used. However, since these conveying devices are of the commonly used type, they are not shown in the drawings and the explanations are omitted here.

Figure 3A:
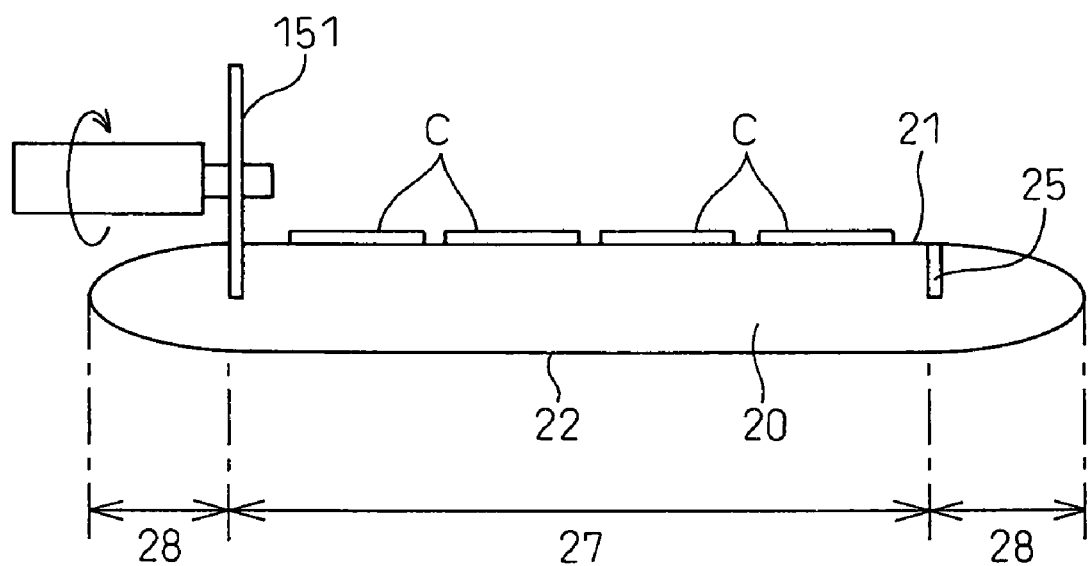
FIG. 3a is a view showing a state of dicing executed by a preceding dicing unit.

The wafer 20 is first supplied to the preceding dicing unit 150 of the wafer processing device 100. The front surface 21 of the wafer 20 is diced in the preceding dicing unit 150. FIG. 3a is a view showing a state of dicing executed in the preceding dicing unit. As shown in FIG. 3a, the wafer 20 is arranged in such a manner that the front surface 21 of the wafer 20 is directed upward. The groove 25 is formed on the front surface 21 of the wafer 20 by the relatively small dicing blade 151. In FIG. 3a, the groove 25 is formed on a boundary between the chamfer portion 28 and the flat portion 27 of the wafer 20. However, the groove 25 may be formed on the flat portion 27 side with respect to the boundary. When the dicing blade 151 is relatively moved along the entire periphery of the wafer 20, the annular groove 25 can be formed. In this connection, the depth of the groove 25 shown in FIG. 3a is approximately a half of the thickness of the wafer 20. However, the depth of the groove 25 may be more shallow than that.

In this connection, in FIG. 3a, the groove 25 is formed by the dicing blade 151. However, the groove 25 may be formed by other methods. It is also possible to form the groove 25 by a laser beam dicing device.

Figure 4:
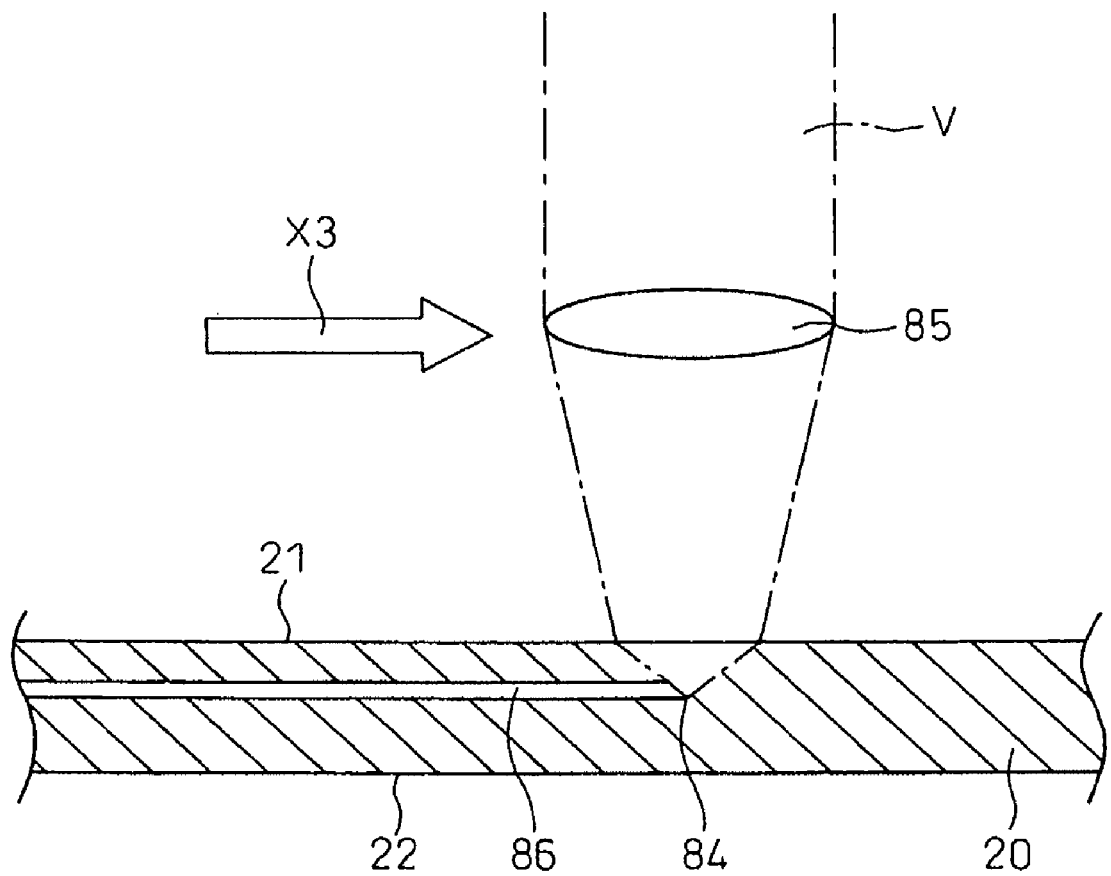
FIG. 4 is a sectional side view for explaining laser beam dicing.

FIG. 4 is a sectional side view for explaining laser beam dicing. In FIG. 4, under the condition that the multiple photon absorption is generated, laser beams V are irradiated from a laser beam source not shown onto the front surface 21 side of the wafer 20 through the condenser lens 85. At this time, the condensing point 84 is adjusted at a position inside the wafer 20 somewhat close to the front surface 21 of the wafer 20. Due to the foregoing, a reforming region is formed around the condensing point 84. Then, when the laser beam V and the condenser lens 85 are moved along the arrow X3, the belt-shaped reforming region 86 is formed inside the wafer 20.

In the laser beam dicing process, the reforming region is formed in such a manner that the laser beam V is transmitted through the wafer 20 and the multiple photon absorption is generated in the wafer 20. Accordingly, the laser beam V is seldom absorbed by the wafer 20 on the front surface 21 of the wafer 20. As a result, there is no possibility that the front surface 21 of the wafer is melted. Further, there is no possibility that cracks, which are out of the cutting line, are generated on the front surface of the wafer.

Since the reforming region 86 is formed on the side somewhat close to the front surface 21, when the reforming region 86 is naturally cracked in the thickness direction toward the front surface 21, the groove 25, the width of which corresponds to the width of the laser beam V, is formed.

Figure 3B:
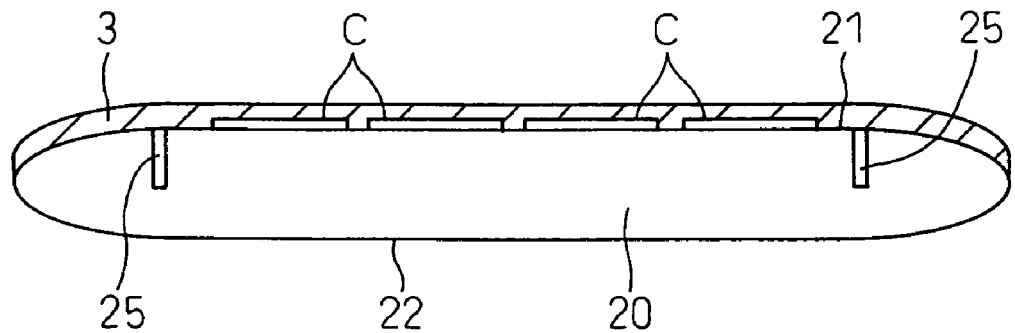
FIG. 3b is a view showing a state of sticking a surface protection film in a sticking unit.

Then, the wafer 20 is conveyed from the preceding dicing unit 150 to the sticking unit 200. FIG. 3b is a view showing a state of sticking the front surface protection film 3 in the sticking unit. As shown in FIG. 3b, in the sticking unit 200, the front surface protection film 3 is stuck onto the front surface 21 of the wafer 20. The front surface protection film 3 has a function of protecting the circuit pattern C, which is formed on the front surface 21 of the wafer, in the back-grinding step executed later.

After the front surface protection film 3 has been stuck, the wafer 20 is conveyed from the sticking unit 20 to the inversion unit 300. The inversion unit 300 has a function of inverting the wafer 20. In the sticking unit 200, the wafer 20, onto the front surface 21 of which the front surface protection film 3 is stuck, is arranged so that the front surface 21 can be directed upward. Accordingly, in the inversion unit 300, the above wafer 20 is inverted upside down and the front surface 21 of the wafer 20, onto which the surface protection film 3 is stuck, is directed downward. Of course, the wafer 20 may only pass through the inversion unit 300 without being inverted.

Figure 5A:
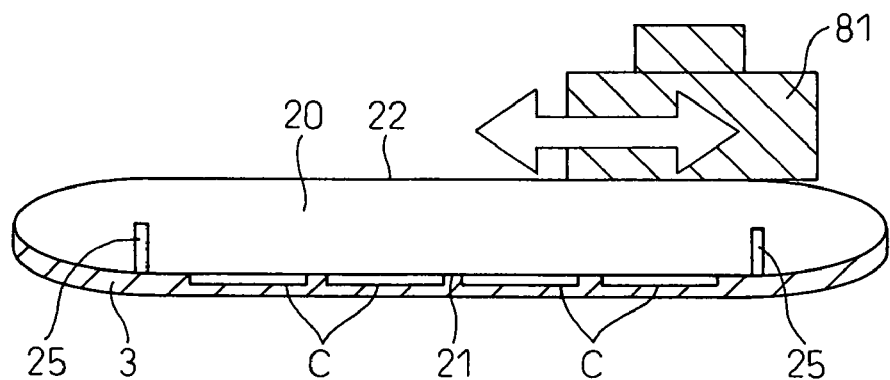
FIG. 5a is a schematic side view showing a state of grinding a back surface in a back surface grinding unit.

The wafer 20, which has been inverted in the inversion unit 300, is supplied to the back surface grinding unit 350 shown in FIG. 1. The wafer 20 is supplied to the back surface grinding unit 350 under the condition that the back surface 22 is directed upward. FIG. 5a is a schematic side view showing a state in which the back surface of the wafer is ground in the back surface grinding unit. As shown in FIG. 5a, in the back surface grinding unit 350, the front surface 21 of the wafer 20 is sucked by a sucking portion not shown. Since the front surface protection film 3 is stuck onto the front surface 21 of the wafer 20 in the sticking unit 200 as described before, even when the front surface 21 of the wafer 20 is sucked, there is no possibility that the circuit pattern C formed on the front surface 21 is damaged.

Figure 5B:
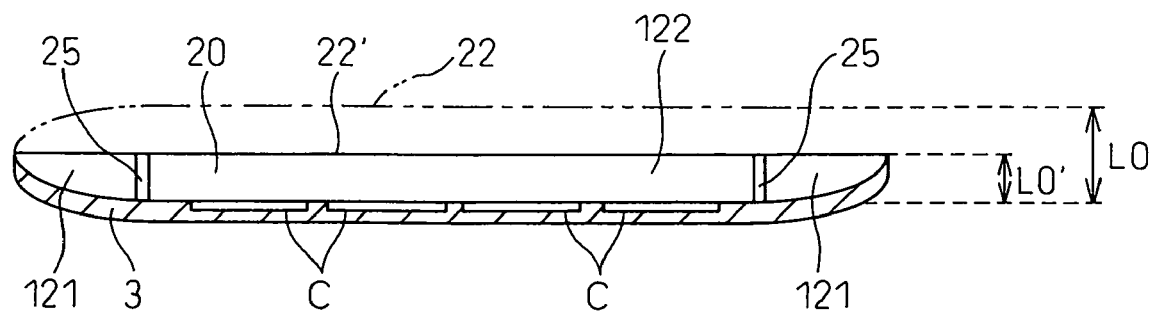
FIG. 5b is a schematic side view showing a state of a wafer after the completion of grinding a back surface.

Then, the grinding portion 81 is arranged on the back surface 22 of the wafer 20 and reciprocated in the arrow direction on the back surface 22 of the wafer 20 as shown in FIG. 5a. As shown in FIG. 5b which is a schematic side view showing a state of the wafer, the back surface of which has been ground, the back surface 22 of the wafer 20 is ground by the grinding portion 81 until it reaches at least a bottom portion of the groove 25. Of course, the back surface may be ground exceeding the bottom portion of the groove 25. Due to the foregoing, the thickness of the wafer 20 is reduced from the initial thickness L0 to the after grinding thickness L0' and operation of the grinding portion 81 is stopped.

Due to the foregoing, the wafer 20 is divided into the first annular portion 121, which contains a peripheral portion of the wafer, and the second annular portion 122 which is located inward the first portion 121. If the groove 25 is formed on the boundary x1 (shown in FIG. 2) between the chamfer portion 28 and the flat portion 27, the first portion 121 is a ring-shaped portion containing the entire chamfer portion 28 of the wafer 20 and the second portion 122 is a portion containing the entire flat portion 27. Since the thickness of the chamfer portion 28, which is the peripheral portion of the wafer, is small, when the back surface of the wafer is ground exceeding a half of the thickness of the wafer, there is a possibility that the chamfer portion is cracked or damaged. However, the first portion 121 is a portion which is not used in the future. Further, the ring-shaped groove 25, which is located inside the chamfer portion 28, is formed. Therefore, even when the first portion 121 is cracked or damaged, cracks or damage of the wafer is stopped at the groove 25. In other words, in the present invention, there is no possibility that the cracks or the damage proceeds to the second portion 122 in which the circuit pattern C is formed.

After the back surface has been ground, the back surface 22' of the wafer 20 is stuck onto the dicing tape 31. This dicing tape 31 is fixed to the dicing frame 15 (shown in FIG. 1) supplied to the back surface grinding unit 350. The dicing frame 15 has a function of easily handling the wafer 20, the thickness of which has been reduced by the back grinding.

Then, as can be seen from FIG. 1, the wafer 20 is returned from the back surface grinding unit 350 to the inversion unit 300. In the inversion unit 300, the wafer 20 is inverted again upside down. Therefore, the front surface 21 of the wafer 20 is directed upward.

In this connection, in a certain type front surface protection film 3, when a predetermined quantity of ultraviolet rays are irradiated to the front surface protection film 3, an adhesive force of the surface protection film 3 is lowered. When this type surface protection film 3 is employed, it is possible to use the ultraviolet ray irradiation unit that is, UV irradiation unit 400 of the wafer processing device 100 shown in FIG. 1. The wafer 20 is supplied to UV irradiation unit 400 together with the dicing frame 15. In UV irradiation unit 400, a predetermined quantity of ultraviolet rays are irradiated onto the front surface protection film 3 by UV lamp 490. Then, the wafer 20 is supplied to the peeling unit 500. In this connection, if a front surface protection film 3, the adhesive force of which is not changed by the irradiation of ultraviolet rays, is used, it is unnecessary that ultraviolet rays are irradiated onto the wafer 20 in UV irradiation unit 400. Therefore, the wafer 20 only passes through UV irradiation unit 400.

Figure 6:
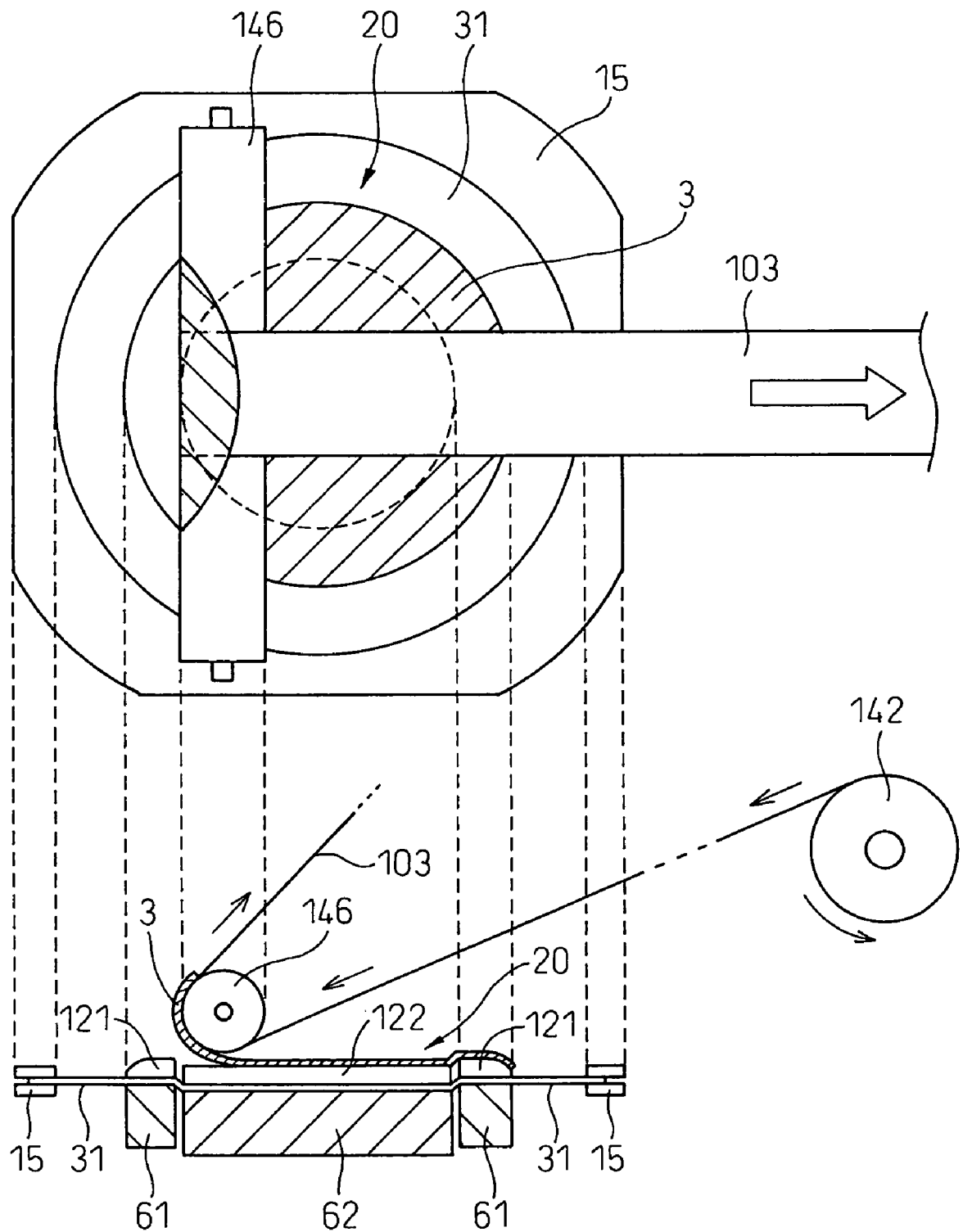
FIG. 6 is a view for explaining a state of a wafer in a peeling unit.
Figure 7:
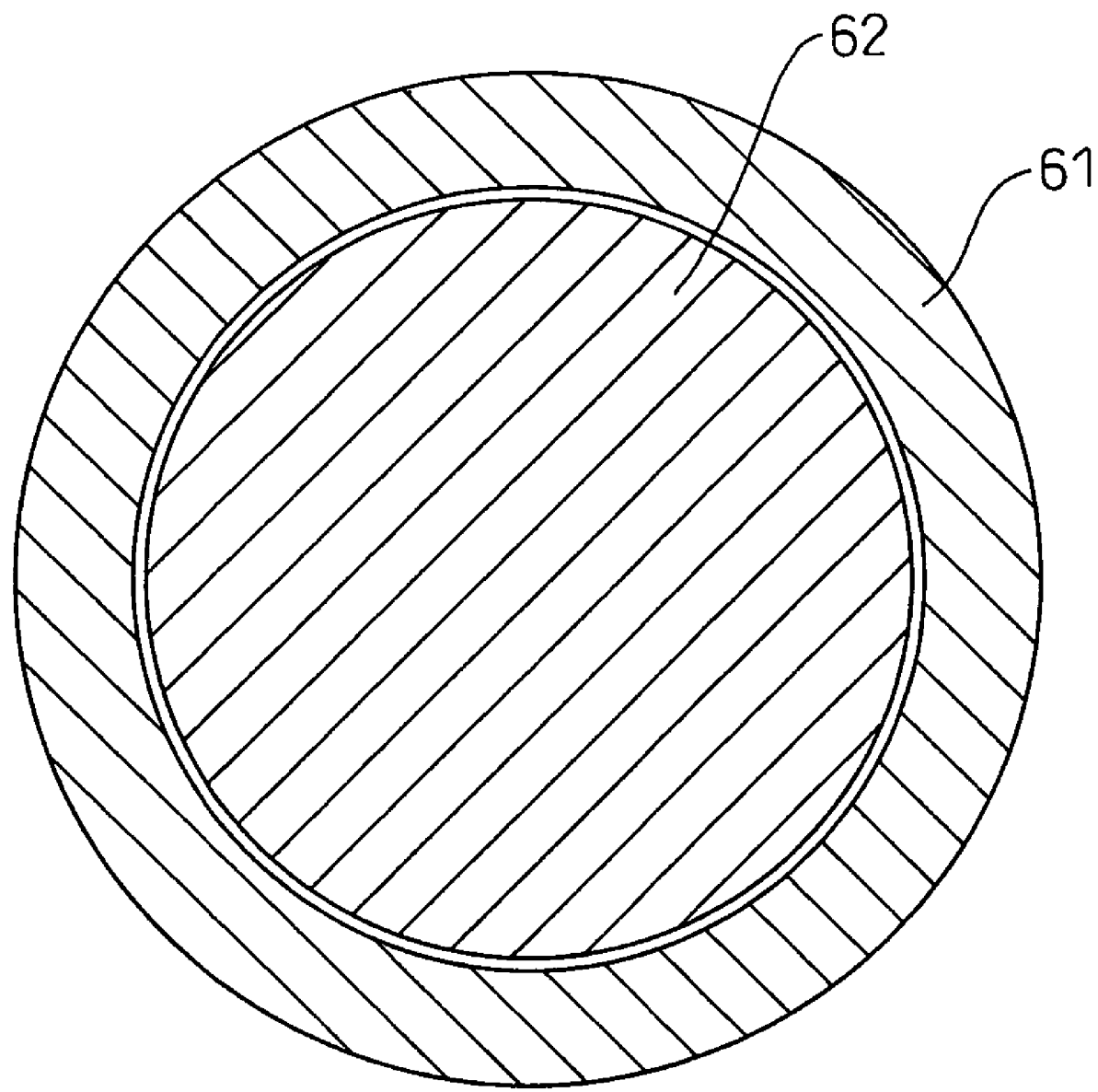
FIG. 7 is a plan view showing a holding table.

Finally, the wafer 20 is supplied to the peeling unit 500 of the wafer processing device 100. FIG. 6 is a view for explaining a state of the wafer in the peeling unit. As shown in FIG. 6, the peeling unit 500 includes: a holding table 61 and a holding table 62, for example suction table, for supporting the first portion 121 and the second portion 122 of the wafer 20, respectively. These holding tables 61, 62 can be moved perpendicularly to the holding face independently from each other. FIG. 7 is a plan view showing the holding table. As can be seen from FIG. 7, these holding tables 61, 62 are respectively formed into shapes corresponding to the shapes of the first portion 121 and the second portion 122 of the wafer 20. In the drawing, a gap corresponding to the width of the groove 25 is formed between these holding tables 61, 62, however, no gap may be formed between these holding tables 61, 62.

In the initial stage, holding faces of these holding tables 61, 62 are on the same plane. Accordingly, the wafer 20 conveyed to the peeling unit 500 is held on these holding tables 61, 62 so that the first portion 121 can be held on the holding table 61 and the second portion 122 can be held on the holding table 62. In this connection, although the dicing frame 15 of the wafer 20 is not held in the drawing, it is actual that the dicing frame 15 is appropriately held by a holding means (not shown) used for holding the dicing frame 15. At the time of peeling the front surface protection film 3, the holding means for holding the dicing frame 15 can be appropriately elevated and lowered.

As shown in FIG. 6, the peeling unit 500 includes a peeling roller 146 capable of being elevated and lowered and moved in the horizontal direction. As shown in the drawing, the peeling roller 146 is longer than the diameter of the wafer 20. The peeling tape 103 is drawn out from the drawing means 142. This peeling tape 103 can be wound by a tape winding means (not shown) via the peeling roller 146.

Figure 8A:
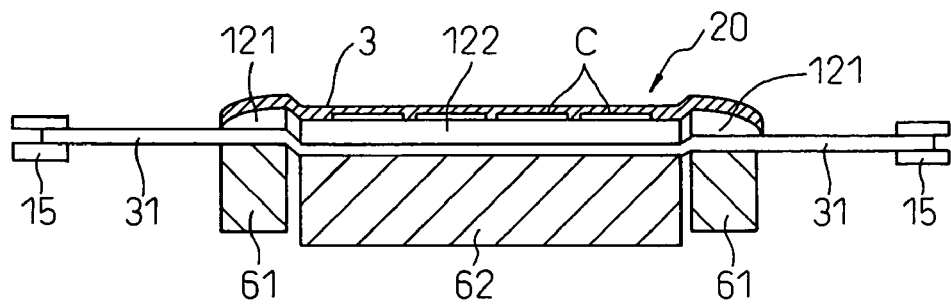
FIG. 8a is a first view explaining a peeling operation of peeling a front surface protection film in a peeling unit.
Figure 8B:
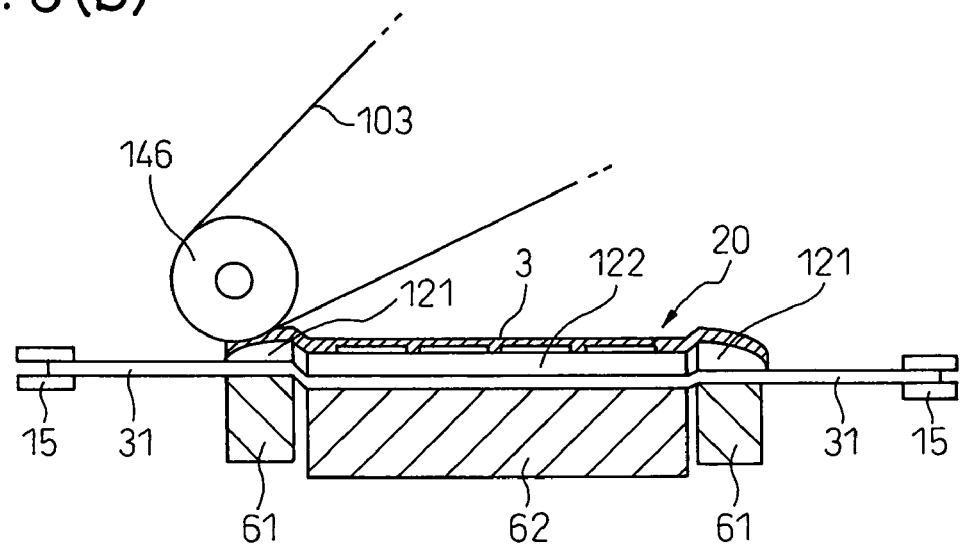
FIG. 8b is a second view explaining a peeling operation of peeling a front surface protection film in a peeling unit.
Figure 8C:
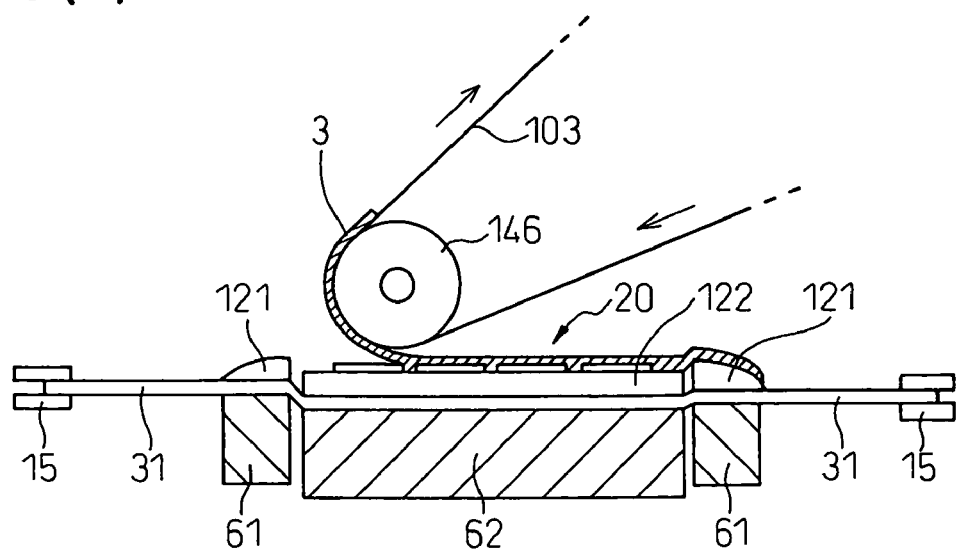
FIG. 8c is a third view explaining a peeling operation of peeling a front surface protection film in a peeling unit.

FIGS. 8a to 8c are views for explaining a peeling operation of peeling the front surface protection film executed in the peeling unit. As shown in FIG. 8a, the first portion 121 and the second portion 122 of the wafer 20 are respectively held by the holding tables 61, 62. Then, the holding table 61, which is arranged outside, is slightly raised and a step portion is formed between the holding tables 61 and 62. At this time, a rising height of the holding table 61 is so small that the front surface protection film 3 and the dicing tape 31 can not be torn, however, the rising height of the holding table 61 is larger than an elastic deformation of the peeling roller 146 described later. Since the first portion 121 and the second portion 122 of the wafer 20 are connected to each other by the front surface protection film 3 and the dicing tape 31, when the holding table 61 is raised, the front surface protection film 3 and the dicing tape 31 are elongated corresponding to the rise of the holding table 61.

Next, when the peeling roller 146 is lowered as shown in FIG. 8b, the peeling roller 146 presses the first portion 121 of the wafer 20 via the peeling tape 103 so that the peeling roller 146 can be slightly elastically deformed. In this case, it is preferable that a pressing position of the peeling roller 146 is a periphery of the outer circumferential portion of the first portion 121. At this time, the peeling roller 146 does not press the second portion 122. By this pressing operation, an adhesive force given between the peeling tape 103 and the front surface protection film 3 is stronger than an adhesive force given between the first portion 121 and the front surface protection film 3. Further, an adhesive force given between the first portion 121 and the dicing tape 31 is stronger than an adhesive force given between the front surface protection film 3 and the peeling tape 103.

After that, as shown in FIG. 8c, while the peeling tape 103 is being wound by a tape winding means (not shown), the peeling roller 146 is moved in parallel with the front surface of the wafer 20. Due to the foregoing, the pressing portion described before functions as a peeling starting portion, that is, the pressing portion functions as a trigger of peeling. Therefore, the front surface protection film 3 is peeled off from the first portion 121 of the wafer 20. Since the first portion 121 and the second portion 122 of the wafer 20 are connected to each other by the front surface protection film 3, when the peeling tape 103 is further wound, the front surface protection film 3 of the second portion 122 is successively peeled off.

Then, when the peeling roller 146 is further moved in parallel with the front surface of the wafer 20, the front surface protection film 3 is peeled in the first portion 121 on the opposite side to the peeling starting portion. Thus, the front surface protection film 3 can be completely peeled off from the entire wafer 20.

Since the first portion 121 of the wafer 20 is annular and the peeling roller 146 is longer than the diameter of the wafer 20 as described before, even when the front surface protection film 3 of the second portion 122 is peeled off, the peeling roller 146 presses only the first portion 121. Accordingly, there is no possibility that the peeling roller 146 presses the second portion 122. In other words, in the present invention, no load is given to the second portion 122 from the peeling roller 146. Accordingly, there is no possibility that the second portion 122 of the wafer 20 is cracked or damaged by the pressing operation of the peeling roller 146. Accordingly, in the present invention, the circuit pattern C of the second portion 122 is not damaged. Therefore, the yield of manufacturing the semiconductor element can be enhanced.

Referring again to FIG. 1, the wafer 20, from which the front surface protection film 3 has been peeled off, is conveyed from the peeling unit 500 to the dicing device 600 together with the dicing frame 15 and subjected to a usual dicing processing.

In the embodiment shown in the drawing, the groove 25 formed between the first portion 121 and the second portion 122 is formed on the boundary x1 between the flat portion 27 and the chamfer portion 28 of the wafer 20. In the present invention, it is preferable that the groove 25 is formed on the boundary x1 or inside the boundary x1. In these cases, the height of the inner circumferential portion of the first portion 121 and the height of the outer circumferential portion of the second portion 122 are equal to each other. Accordingly, when the first portion 121 is slightly raised, a step portion, the size of which is sufficient to prevent the peeling roller 146 from pressing the second portion 122, can be easily formed. At this time, since a distance of rising of the first portion 121 is relatively small, the front surface protection film 3 or the dicing tape 31 is seldom torn.

Figure 9A:
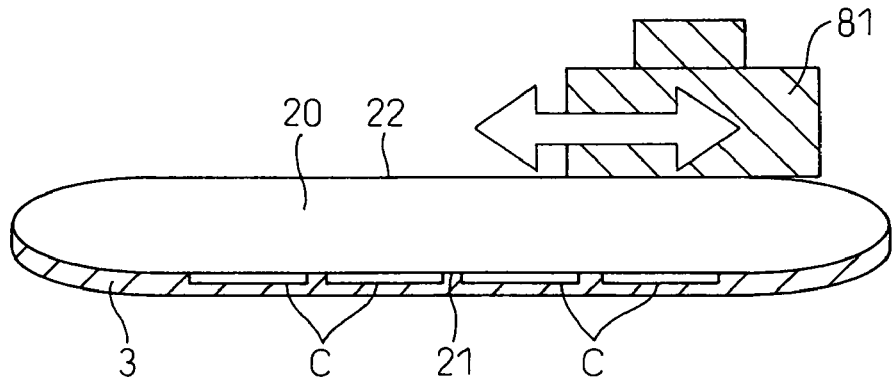
FIG. 9a is another schematic side view showing a state of grinding a back surface in a back surface grinding unit.
Figure 9B:
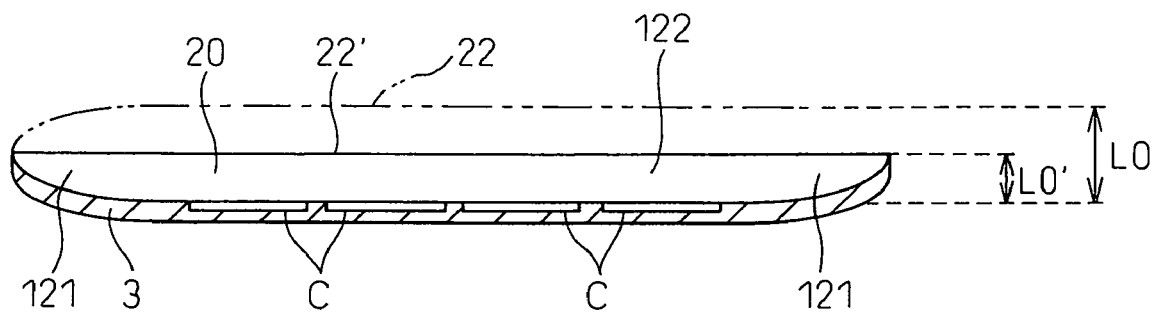
Figure 9C:
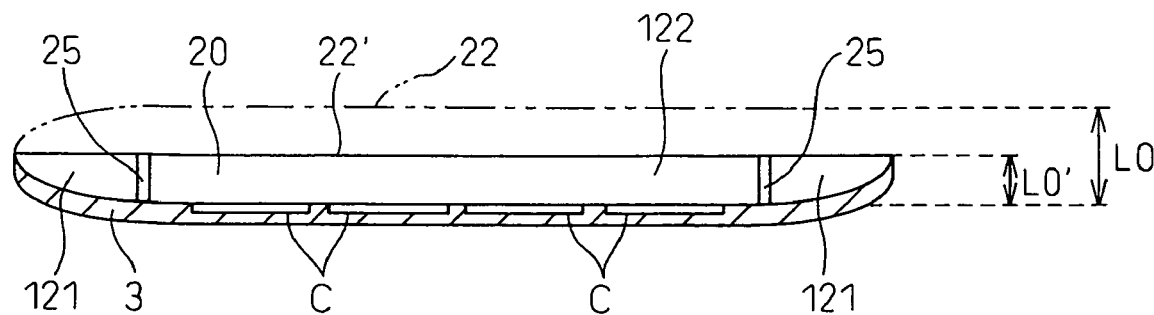
FIG. 9c is a schematic side view showing a state of a wafer on which a groove is formed after the completion of grinding a back surface.

FIG. 9a is another schematic side view showing a state of grinding a back surface in a back surface grinding unit. FIG. 9b is a schematic side view showing a state of a wafer after the completion of grinding a back surface in FIG. 9a. Further, FIG. 9c is a schematic side view showing a state of a wafer on which a groove is formed after the completion of grinding a back surface.

As shown in FIG. 9a, the wafer 20 may be supplied to the grinding unit 350 before the groove 25 is formed on the wafer 20, onto the front surface 21 of which the front surface protection film 3 is stuck. The back surface 22 of the wafer 20 is ground by the grinding portion 81 until the thickness of the wafer 20 is reduced from L0 to L0' (FIG. 9b). After that, as shown in FIG. 9c, the groove 25 is formed from the back surface 22 of the wafer 20 to the front surface 21. The groove 25 is formed at the same position as the position that is referred in FIG. 5. Since the front surface protection film 3 is not cut off at the time of forming the groove 25, only the wafer 20 is divided into the first portion 121, the shape of which is annular, and the second portion 122 which is located inward the first portion 121. The front surface protection film 3 of the wafer 20 in this condition may be peeled off by the same method as that described before. It is clear that the same advantages as those described before can be obtained in this case.

In the embodiment shown in the drawing, the step portion is formed when the holding table 61 is raised. However, the same step portion may be formed when the holding table 62 is lowered while the holding table 61 is being maintained at a predetermined height. The present invention includes a case in which the front surface protection film 3 is peeled off by a peeling means except for the peeling roller 146, for example, by a peeling blade.

DESCRIPTION OF REFERENCE NUMERALS AND SIGNS

3 Front surface protection film
15 Dicing frame
20 Wafer
21 Front surface
22 Back surface
25 Groove
27 Flat portion
28 Chamfer portion
31 Dicing tape
61, 62 Holding table
100 Wafer processing device
103 Peeling tape
121 First portion
122 Second portion
142 Tape drawing means
146 Peeling roller
150 Preceding dicing unit
200 Sticking unit
300 Inversion unit
350 Back surface grinding unit
400 UV irradiating unit
500 Peeling unit
600 Dicing unit
x1 Boundary

The invention claimed is:

1. A method of peeling a film stuck to a first portion including a peripheral portion of a wafer and also stuck to a second portion located inward with respect to the first portion, comprising:

moving the first portion and/or the second portion of the wafer relative to each other so that the film on the first portion can be located at a position higher than the film on the second portion;

drawing out a peeling tape onto the film on the first and the second portions; and pressing a peeling means against the film on the first portion via the peeling tape, wherein when the peeling means is moved along the first portion, the film is peeled away from the first and the second portions of the wafer.

2. A film peeling method comprising:

forming a groove on one face of a wafer along an entire peripheral portion of the wafer inside the peripheral portion of the wafer;

sticking a film onto the face of the wafer on which the groove is formed; and grinding a face of the wafer, which is on the opposite side of the groove, until reaching at least a bottom portion of the groove so that the wafer can be divided into a first portion including the peripheral portion and a second portion located inward with respect to the first portion, moving relatively the first portion and/or the second portion of the wafer so that the film on the first portion can be located at a position higher than the film on the second portion;

drawing out a peeling tape onto the film on the first and the second portions; and pressing a peeling means against the film on the first portion via the peeling tape, wherein when the peeling means is moved along the first portion, the film is peeled away from the first and the second portions of the wafer.

3. A film peeling method comprising the steps of:

sticking a film onto a first face of a wafer;

grinding a second face on the opposite side to the first face of the wafer; and forming a groove on the second face of the wafer along an overall peripheral portion of the wafer inside a peripheral portion of the wafer so that the groove can reach the first face of the wafer, wherein the wafer being divided into a first portion, which contains the peripheral portion, and a second portion located inward with respect to the first portion, moving the first portion and/or the second portion of the wafer relative to each other so that the film on the first portion can be located at a position higher than the film on the second portion;

drawing out a peeling tape onto the film on the first and the second portions; and pressing a peeling means against the first portion film via the peeling tape, wherein the film is peeled away from the first and the second portions when the peeling means is moved along the first portion.

4. A film peeling method according to claim 2 or 3, wherein the groove is formed when a reforming region is formed in the wafer by irradiating laser beams.

5. A film peeling method according to any one of claim 1, 2 or 3, wherein the wafer includes a chamfer portion and a flat portion, and wherein the groove is formed on a boundary between the chamfer portion and the flat portion of the wafer or inside the boundary.

* * * * *

UNITED STATES PATENT AND TRADEMARK OFFICE
CERTIFICATE OF CORRECTION

| | |
|---|---|
| PATENT NO. | : 8,052,824 B2 |
| APPLICATION NO. | : 12/084473 |
| DATED | : November 8, 2011 |
| INVENTOR(S) | : Masaki Kanazawa |

It is certified that error appears in the above-identified patent and that said Letters Patent is hereby corrected as shown below:

In the Claims

Column 12, Claim 5, line 48.        Delete "claim"
                                    Insert --claims--

Signed and Sealed this
Nineteenth Day of June, 2012

David J. Kappos
*Director of the United States Patent and Trademark Office*